United States Patent
Lesartre et al.

(10) Patent No.: US 7,613,958 B2
(45) Date of Patent: Nov. 3, 2009

(54) ERROR DETECTION IN A SYSTEM HAVING COUPLED CHANNELS

(75) Inventors: Gregg Bernard Lesartre, Ft. Collins, CO (US); Gary Belgrave Gostin, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 419 days.

(21) Appl. No.: 10/756,529

(22) Filed: Jan. 12, 2004

(65) Prior Publication Data

US 2005/0154968 A1 Jul. 14, 2005

(51) Int. Cl.
*G06F 11/00* (2006.01)
(52) U.S. Cl. .................................. 714/701; 714/800
(58) Field of Classification Search ................. 714/701, 714/801, 776, 800
See application file for complete search history.

(56) References Cited

U.S. PATENT DOCUMENTS

| | | | |
|---|---|---|---|
| 3,676,859 A | 7/1972 | Hollaway et al. | |
| 4,047,159 A | 9/1977 | Boudry | |
| 4,332,793 A | 6/1982 | Olson | |
| 4,490,788 A | 12/1984 | Rasmussen | |
| 4,569,052 A | 2/1986 | Cohn | |
| 4,611,614 A | 9/1986 | Schmidt | |
| 4,677,614 A | 6/1987 | Circo | |
| 4,884,263 A | 11/1989 | Suzuki | |
| 5,068,854 A | 11/1991 | Chandran | |
| 5,414,830 A | 5/1995 | Marbot | |
| 5,487,151 A | 1/1996 | Kikuchi | |
| 5,754,789 A | 5/1998 | Nowatzyk | |
| 5,790,563 A | 8/1998 | Ramamurthy | |
| 5,907,566 A | 5/1999 | Benson | |
| 5,956,370 A | 9/1999 | Ducaroir | |
| 6,052,812 A | 4/2000 | Chen | |
| 6,085,257 A | 7/2000 | Ducaroir | |
| 6,092,233 A | 7/2000 | Yang | |
| 6,154,870 A | 11/2000 | Fredrickson | |
| 6,167,077 A | 12/2000 | Ducaroir | |
| 6,173,423 B1 | 1/2001 | Autechaud | |
| 6,202,108 B1 | 3/2001 | Autechaud | |
| 6,233,073 B1 | 5/2001 | Bowers | |
| 6,292,906 B1 | 9/2001 | Fu | |
| 6,311,239 B1 | 10/2001 | Matthews | |
| 6,313,932 B1 * | 11/2001 | Roberts et al. ................. 398/9 |
| 6,374,389 B1 * | 4/2002 | Tuma et al. ................. 714/802 |
| 6,404,739 B1 | 6/2002 | Gonno | |
| 6,449,694 B1 | 9/2002 | Burgess | |
| 6,516,952 B1 | 2/2003 | Wang | |

(Continued)

OTHER PUBLICATIONS

IBM Corporation, "Blue Logic Ethernet Family of Cores", IBM Microelectronics Division, (2001), (located at www.ibm.com/chips).

(Continued)

*Primary Examiner*—M. Mujtaba K Chaudry

(57) ABSTRACT

A data communications architecture employing serializers and deserializers that reduces data communications latency. In an illustrative implementation, the data communications architecture communicates data across communications links. The architecture maintains various mechanisms to promote data communications speed and to avoid communication link down time. These mechanisms perform the functions including but not limited to handling uncertain data arrival times, detecting single bit and multi-bit errors, handling communications link failures, addressing failed link training, identifying and marking data as corrupt, and identifying and processing successful data transactions across the communications link.

14 Claims, 12 Drawing Sheets

U.S. PATENT DOCUMENTS

| | | | |
|---|---|---|---|
| 6,556,152 | B2 | 4/2003 | Pitio |
| 6,587,432 | B1 | 7/2003 | Putzolu |
| 6,628,679 | B1 | 9/2003 | Talarek |
| 6,647,428 | B1 | 11/2003 | Bannai |
| 6,653,957 | B1 | 11/2003 | Patterson |
| 6,662,332 | B1 | 12/2003 | Kimmitt |
| 6,671,833 | B2 * | 12/2003 | Pitio .......................... 714/701 |
| 6,684,351 | B1 | 1/2004 | Bendak |
| 6,690,682 | B1 | 2/2004 | Giaretta |
| 6,738,935 | B1 * | 5/2004 | Kimmitt ..................... 714/701 |
| 6,771,671 | B1 | 8/2004 | Fields |
| 6,834,362 | B2 | 12/2004 | Nishtala |
| 6,850,559 | B1 | 2/2005 | Driessen |
| 6,894,969 | B1 | 5/2005 | Chidambaran |
| 6,963,533 | B2 | 11/2005 | Kukic |
| 6,985,502 | B2 | 1/2006 | Bunton |
| 6,992,987 | B2 | 1/2006 | Kobayashi |
| 7,010,607 | B1 | 3/2006 | Bunton |
| 7,010,612 | B1 | 3/2006 | Si |
| 7,013,419 | B2 | 3/2006 | Kagan |
| 7,016,304 | B2 | 3/2006 | Chou |
| 7,035,294 | B2 | 4/2006 | Dove |
| 7,039,837 | B2 | 5/2006 | Martini |
| 7,046,623 | B2 | 5/2006 | Kukic |
| 7,054,331 | B1 | 5/2006 | Susnow |
| 7,058,010 | B2 | 6/2006 | Chidambaran |
| 7,062,568 | B1 | 6/2006 | Senevirathne |
| 7,065,101 | B2 | 6/2006 | Ziegler |
| 7,073,001 | B1 | 7/2006 | Kucharewski |
| 7,082,556 | B2 | 7/2006 | Fishman |
| 7,159,137 | B2 | 1/2007 | Nemawarkar |
| 7,180,867 | B2 | 2/2007 | Hoch |
| 7,200,790 | B2 | 4/2007 | Sharma |
| 7,243,291 | B1 * | 7/2007 | Williams .................... 714/776 |
| 7,251,764 | B2 | 7/2007 | Bonneau |
| 7,269,759 | B2 | 9/2007 | Biles |
| 2002/0001287 | A1 | 1/2002 | Bergenwall |
| 2002/0087921 | A1 | 7/2002 | Rodriguez |
| 2002/0122503 | A1 | 9/2002 | Agazzi |
| 2002/0133762 | A1 | 9/2002 | Susnow |
| 2002/0146876 | A1 | 10/2002 | Saruwatari |
| 2003/0002505 | A1 | 1/2003 | Hoch |
| 2003/0061390 | A1 | 3/2003 | Schaller |
| 2003/0095575 | A1 | 5/2003 | Annadurai |
| 2003/0103253 | A1 | 6/2003 | Bunton |
| 2003/0112798 | A1 | 6/2003 | Ziegler |
| 2003/0112881 | A1 | 6/2003 | Cox |
| 2003/0120852 | A1 | 6/2003 | McConnell |
| 2003/0123444 | A1 | 7/2003 | Watanabe |
| 2003/0145134 | A1 | 7/2003 | Wehage |
| 2003/0149922 | A1 | 8/2003 | Lai |
| 2003/0158992 | A1 | 8/2003 | Ajanovic |
| 2003/0189903 | A1 | 10/2003 | Hsu |
| 2003/0226085 | A1 | 12/2003 | Tucker |
| 2004/0071250 | A1 | 4/2004 | Bunton |
| 2004/0083077 | A1 | 4/2004 | Baumer |
| 2004/0103333 | A1 | 5/2004 | Martwick |
| 2005/0021823 | A1 * | 1/2005 | Sharma et al. .............. 709/232 |
| 2005/0073586 | A1 | 4/2005 | Li |
| 2005/0076280 | A1 | 4/2005 | Martinez |
| 2005/0081823 | A1 | 4/2005 | Muto |
| 2005/0108458 | A1 | 5/2005 | Vogt |
| 2005/0149705 | A1 | 7/2005 | Gupta |

OTHER PUBLICATIONS

IBM Corporation, "Blue Logic High-Speed SERDES Family of Cores", IBM Microelectronics Division, (2003), (located at www.ibm.com/chips).
Notice of Allowance for U.S. Appl. No. 10/756,435 dated Aug. 13, 2008 in the United States.
Notice of Allowance for U.S. Appl. No. 10/756,435 dated May 6, 2008 in the United States.
Office Action for U.S. Appl. No. 10/756,435 dated Nov. 15, 2007 in the United States.
Final Office Action for U.S. Appl. No. 10/756,530 dated Jul. 27, 2007 in the United States.
Office Action for U.S. Appl. No. 10/756,530 dated Apr. 2, 2007 in the United States.
Final Office Action for U.S. Appl. No. 10/756,530 dated Nov. 27, 2006 in the United States.
Office Action for U.S. Appl. No. 10/756,530 dated Jul. 25, 2006 in the United States.
Notice of Allowance for U.S. Appl. No. 10/756,667 dated Jan. 28, 2009 in the United States.
Final Office Action for U.S. Appl. No. 10/756,667 dated Dec. 29, 2008 in the United States.
Office Action for U.S. Appl. No. 10/756,667 dated Jun. 12, 2008 in the United States.
Notice of Allowance for U.S. Appl. No. 10/756,439 dated Aug. 8, 2007 in the United States.
Office Action for U.S. Appl. No. 10/756,439 dated Feb. 22, 2007 in the United States.
Office Action for U.S. Appl. No. 10/756,439 dated Sep. 8, 2006 in the United States.
Notice of Allowance for U.S. Appl. No. 10/756,685 dated Mar. 23, 2009 in the United States.
Notice of Allowance for U.S. Appl. No. 10/756,685 dated Nov. 28, 2008 in the United States.
Office Action for U.S. Appl. No. 10/756,685 dated Jul. 10, 2008 in the United States.
Office Action for U.S. Appl. No. 10/756,685 dated Dec. 13, 2007 in the United States.
Office Action for U.S. Appl. No. 10/756,685 dated Jun. 27, 2007 in the United States.
Notice of Allowance for U.S. Appl. No. 11/056,471 dated May 21, 2009 in the United States.
Notice of Allowance for U.S. Appl. No. 10/756,441 dated Jul. 29, 2008 in the United States.
Office Action for U.S. Appl. No. 10/756,441 dated Oct. 5, 2007 in the United States.
Mike Berry, All SPI-4s Are Not Created Equal dated Feb. 20, 2003, EDN: Voice of the Electronics Engineer article, 5 pages.
Link De-Skew And Training Sequence, InfiniBand TM Architecture Release 1.0 Link/Phy Interface dated Oct. 24, 2000, vol. 2-Physical Specifications, 15 pages.
Lynch and Thorn, Serial Channel to I/O Interface, IP.com No. IPCOM00087409D dated Jan. 1, 1977, 5 pages.
Notice of Allowance for U.S. Appl. No. 10/756,600 dated Dec. 14, 2007 in the United States.
Office Action for U.S. Appl. No. 10/756,600 dated Apr. 27, 2007 in the United States.
Final Office Action for U.S. Appl. No. 10/756,600 dated Jan. 26, 2007 in the United States.
Office Action for U.S. Appl. No. 10/756,600 dated Aug. 9, 2007 in the United States.
Notice of Allowance for U.S. Appl. No. 11/056,471 dated Jan. 28, 2009 in the United States.
Office Action for U.S. Appl. No. 11/056,471 dated Jul. 31, 2006 in the United States.
Final Office Action for U.S. Appl. No. 11/056,066 dated Apr. 21, 2008 in the United States.
Office Action U.S. Appl. No. 11/056,066 dated Nov. 27, 2007 in the United States.
Notice of Allowance for U.S. Appl. No. 11/056,472 dated Oct. 9, 2008 in the United States.
Final Office Action for U.S. Appl. No. 11/056,472 dated Jul. 17, 2008 in the United States.
Office Action for U.S. Appl. No. 11/056,472 dated Jan. 30, 2008 in the United States.
Notice of Allowance for U.S. Appl. No. 11/056,505 dated Jan. 22, 2009 in the United States.
Final Office Action for U.S. Appl. No. 11/056,505 dated May 5, 2008 in the United States.
Office Action for U.S. Appl. No. 11/056,505 dated Nov. 27, 2007 in the United States.

* cited by examiner

ERROR DETECTION IN A SYSTEM HAVING COUPLED CHANNELS

CROSS REFERENCE

This application is related in whole or in part to the following U.S. patent applications Ser. Nos. 10/756,441; 10/756,439, 10/756,685; 10/756,435; 10/756,530; 10/756,667; and 10/756,600, and cross references such applications.

FIELD OF THE INVENTION

The present invention relates to data communications architectures for computer processors and, more particularly, to communications architectures for computer processors employing serializers and deserializers.

BACKGROUND

Computing architectures that operate efficiently and that can process data quickly are generally preferred over their counterparts. The speed at which these computing architectures process data may be limited by a number of factors that include the design of the architecture, operating conditions, quality of utilized components, and the protocols, logic, and methodologies employed by the computer architecture when processing data. Latencies in the communication of data across components arising from data communications architectures and protocols of a computing architecture may also impact the speed at which data may be processed.

A number of data communications architectures are currently employed to communicate data between cooperating components of a computer architecture (e.g. computer processors within a computing environment's processing unit or between a computer processor and peripheral component such as a data storage drive). For example, IDE/ATA (Integrated Drive Electronics/Advanced Technology Attachment) and SCSI (Small Computer Systems Interface) are both common interfaces to hard drives (as well as some other devices, such as CD-ROM and DVD drives), and there are several flavors of each. Other data communications architectures include PCI (Peripheral Components Interconnect), AGP (Accelerated Graphics Port), USB (Universal Serial Bus), serial data communications ports, and parallel data communications ports.

Although each of the above data communications architectures are effective in transmitting data between cooperating components, each of these architectures have drawbacks and performance limitations. Specifically, such data communication architectures are not designed to handle voluminous amounts of data communications, which are communicated at high clock frequencies (e.g. several Giga Hertz). Additionally, the PCI, IDE, and SCSI data communication architectures generally require overhead processing calculations when communicating data that impacts overall data communications speed. Stated differently, in addition to the desired data being communicated additional overhead processing data must be communicated. As such, less overall data is processed during each clock cycle.

Responsive to the need for higher bandwidth data communications architectures, the SERDES (serializer/deserializer) data communications architecture was developed. SERDES operates to encode and decode data according to a predefined scheme (e.g. eight-bit/ten-bit-8b10b encoding). The encoded data is communicated over one or more communication channels from the serializer to a corresponding deserializer for decoding. The SERDES data communication architecture has been shown to increase data communications bandwidth between cooperating components. In this context, SERDES data communication architectures are deployed as data buses operating to carry data between cooperating components.

SUMMARY

A data communications architecture employing serializers and deserializers for use in communicating data between computer processing components of a computing environment to reduce latency is provided. In an illustrative implementation, a data communications architecture comprises a data interface, a serializer, and a deserializer. In operation, data from computer processing components is received by the serializer. The serializer cooperating with the data interface encodes the data for communication to the deserializer according to a selected encoding protocol. Operationally, the serializer and deserializer (SERDES) cooperate to form a communications link or communications channel. The data interface, among other things, allows for the collection of data to be transferred across the link from each end of the link, provides link management and control information, encodes error protection and provides logic for processing the data across the communications channel.

Further to the exemplary implementation, the illustrative data communications architecture further comprises a link training status monitor, a link training module, a monitoring module, data buffer, a link training module, a parity bit module, a data transmission acknowledgement module, and a data buffer. These modules comprise a portion of the serializer and the deserializer. In operation, these modules cooperate with the data interface and instruction sets contained in the serializer and deserializer to realize functions including, but not limited to, handling uncertain data arrival times, detection of single bit and multi-bit errors, handling communications link failures, addressing failed link training, identifying and marking data as corrupt, and identifying and processing successful data transactions across the communications link.

Other features of the invention are further described below.

BRIEF DESCRIPTION OF THE DRAWINGS

The data communications architecture and methods of use are further described with reference to the accompanying drawings in which.

DETAILED DESCRIPTION OF THE ILLUSTRATIVE IMPLEMENTATIONS

Overview:

To provide the infrastructure bandwidth required computing environments, implementations have turned to utilizing serializers/deserializers (SERDES) point to point data communications architectures operating at high frequencies. In applying the SERDES data communications architecture to a computing environment's internal data communications infrastructure, a number of limitations come to light. In general terms, latency in data communications arise from inefficient data communications architecture management. The management of the SERDES data communications architecture may be performed by a data interface that, among other things, collects data for communication along the SERDES communication links and provides error detection and handling instructions for errant data.

The present invention provides a data interface for use by SERDES link channels that support operations occurring bi-directionally between data communications architecture components. In an illustrative implementation, a mechanism is provided to collect data for transfer across a SERDES link from each end of the link. Additionally the mechanism may operate to provide overlay link management information, to encode error protection, and to encode the data into the proper format. The data interface of the herein described illustrative implementation also maintains logic that accepts to direct SERDES components to collect and communicate data between SERDES link components and to check that such data is correctly collected and communicated.

The illustrative SERDES data communications architecture may also employ a data buffer to store data. In operation, the data buffer may be used to store data until correct receipt is confirmed by a response from the receiving end of a SERDES communications link. In such case, an acknowledgement may be embedded as part of data communicated between cooperating components of the SERDES data communications architecture. When an error is detected by SERDES components, the data buffer may be used to resend the data to correct the error.

Furthermore, the illustrative implementation may orchestrate the use of multiple parallel SERDES communications channels. A SERDES communications channel may comprise a logical communications link operating on a physical link (e.g. wires) between SERDES components (e.g. serializers and deserializers). When performing error detection, training, and other operations, the illustrative SERDES data communications architecture may employ a spare channel. Additionally, such spare channel may be used to maintain communication availability even in the event of a hard failure of one of the channels.

The illustrative implementation provides the flexibility to drive various media—cable, PC trace, or though an appropriate buffer fiber and supports a variety of link frequencies to work best with the chosen media.

Illustrative Computing Environment

Figure 1:
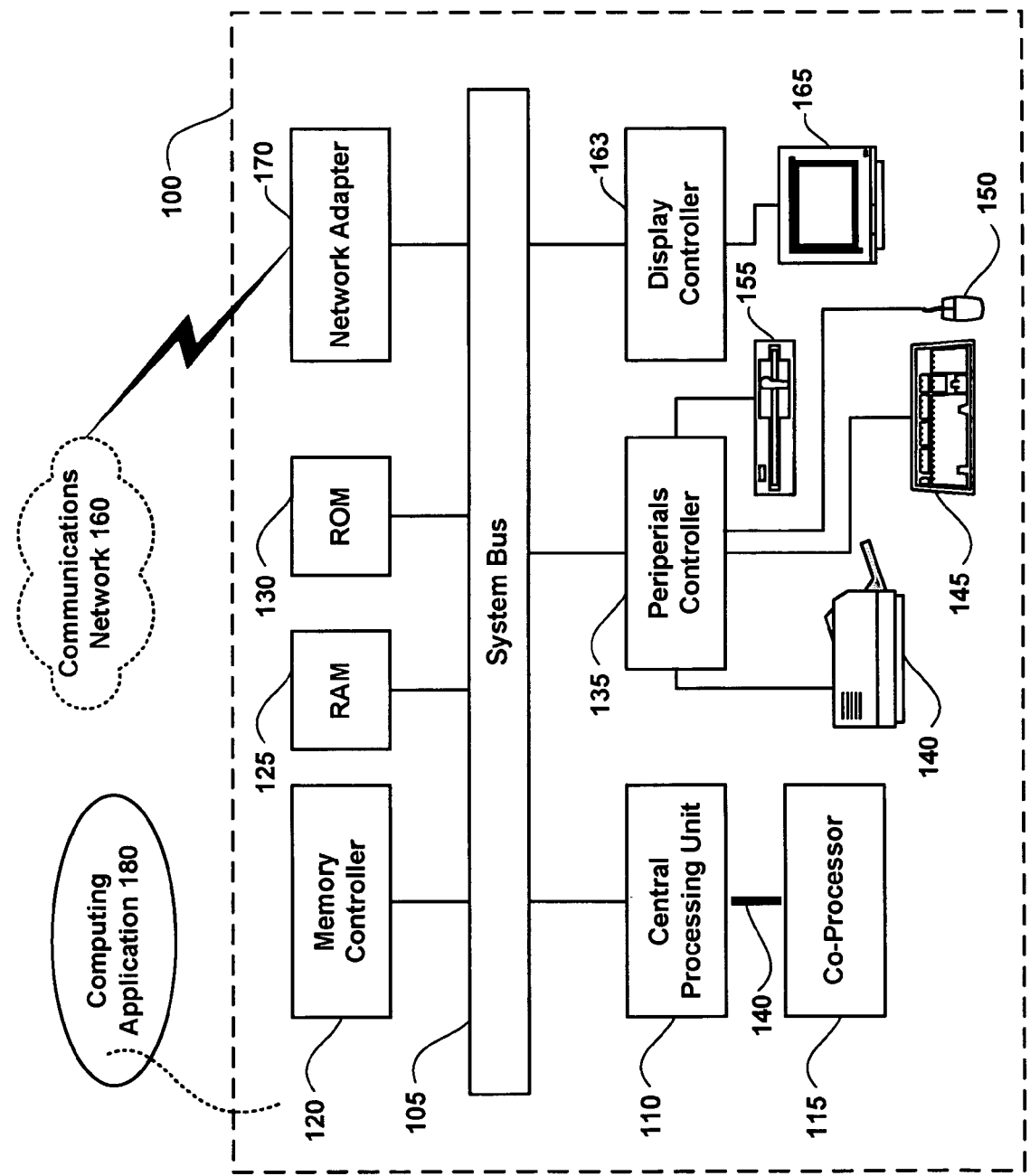
FIG. 1 is a block diagram of an exemplary computing environment in accordance with an implementation of the herein described systems and methods.

FIG. 1 depicts an exemplary computing system 100 in accordance with herein described system and methods. Computing system 100 is capable of executing a variety of computing applications 180. Exemplary computing system 100 is controlled primarily by computer readable instructions, which may be in the form of software, where and how such software is stored or accessed. Such software may be executed within central processing unit (CPU) 110 to cause data processing system 100 to do work. In many known computer servers, workstations and personal computers central processing unit 110 is implemented by a micro-electronic chips CPUs called microprocessors. Coprocessor 115 is an optional processor, distinct from main CPU 110, that performs additional functions or assists CPU 110. One common type of coprocessor is the floating-point coprocessor, also called a numeric or math coprocessor, which is designed to perform numeric calculations faster and better than general-purpose CPU 110.

It is appreciated that although illustrative computing environment is shown to comprise a single CPU 110 that such description is merely illustrative as computing environment 100 may comprises a number of CPUs 110. Additionally computing environment 100 may exploit the resources of remote CPUs (not shown) through communications network 160 or some other data communications means (not shown).

In operation, CPU 110 fetches, decodes, and executes instructions, and transfers information to and from other resources via the computer's main data-transfer path, system bus 105. Such a system bus connects the components in computing system 100 and defines the medium for data exchange. System bus 105 typically includes data lines for sending data, address lines for sending addresses, and control lines for sending interrupts and for operating the system bus. An example of such a system bus is the PCI (Peripheral Component Interconnect) bus. Some of today's advanced busses provide a function called bus arbitration that regulates access to the bus by extension cards, controllers, and CPU 110. Devices that attach to these busses and arbitrate to take over the bus are called bus masters. Bus master support also allows multiprocessor configurations of the busses to be created by the addition of bus master adapters containing a processor and its support chips.

Memory devices coupled to system bus 105 include random access memory (RAM) 110 and read only memory (ROM) 130. Such memories include circuitry that allows information to be stored and retrieved. ROMs 130 generally contain stored data that cannot be modified. Data stored in RAM 125 can be read or changed by CPU 110 or other hardware devices. Access to RAM 125 and/or ROM 130 may be controlled by memory controller 120. Memory controller 105 may provide an address translation function that translates virtual addresses into physical addresses as instructions are executed. Memory controller 120 may also provide a memory protection function that isolates processes within the system and isolates system processes from user processes. Thus, a program running in user mode can normally access only memory mapped by its own process virtual address space; it cannot access memory within another process's virtual address space unless memory sharing between the processes has been set up.

In addition, computing system 100 may contain peripherals controller 135 responsible for communicating instructions from CPU 110 to peripherals, such as, printer 140, keyboard 145, mouse 150, and data storage drive 155.

Display 165, which is controlled by display controller 163, is used to display visual output generated by computing system 100. Such visual output may include text, graphics, animated graphics, and video. Display 165 may be implemented with a CRT-based video display, an LCD-based flat-panel display, gas plasma-based flat-panel display, or a touch-panel, or other display forms. Display controller 163 includes electronic components required to generate a video signal that is sent to display 165.

Further, computing system 100 may contain network adaptor 170 which may be used to connect computing system 100 to an external communication network 160. Communications network 160 may provide computer users with means of communicating and transferring software and information electronically. Additionally, communications network 185 may provide distributed processing, which involves several computers and the sharing of workloads or cooperative efforts in performing a task. It will be appreciated that the network connections shown are exemplary and other means of establishing a communications link between the computers may be used.

It is appreciated that exemplary computer system 100 is merely illustrative of a computing environment in which the herein described systems and methods may operate and does not limit the implementation of the herein described systems and methods in computing environments having differing components and configurations as the inventive concepts described herein may be implemented in various computing environments having various components and configurations.

Figure 2:
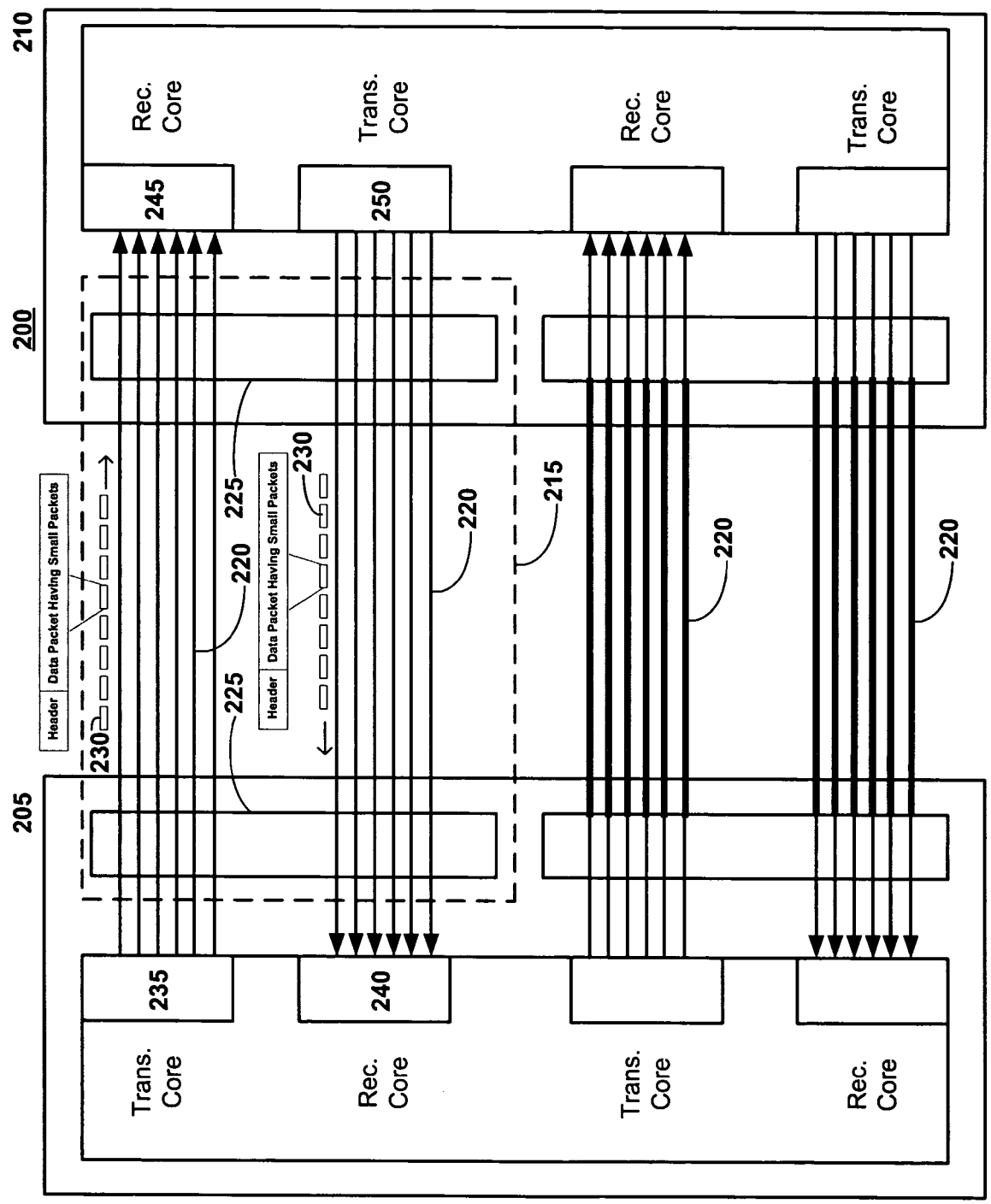
FIG. 2 is a block diagram showing the cooperation of exemplary components of an exemplary data communications architecture.
Figure 3:
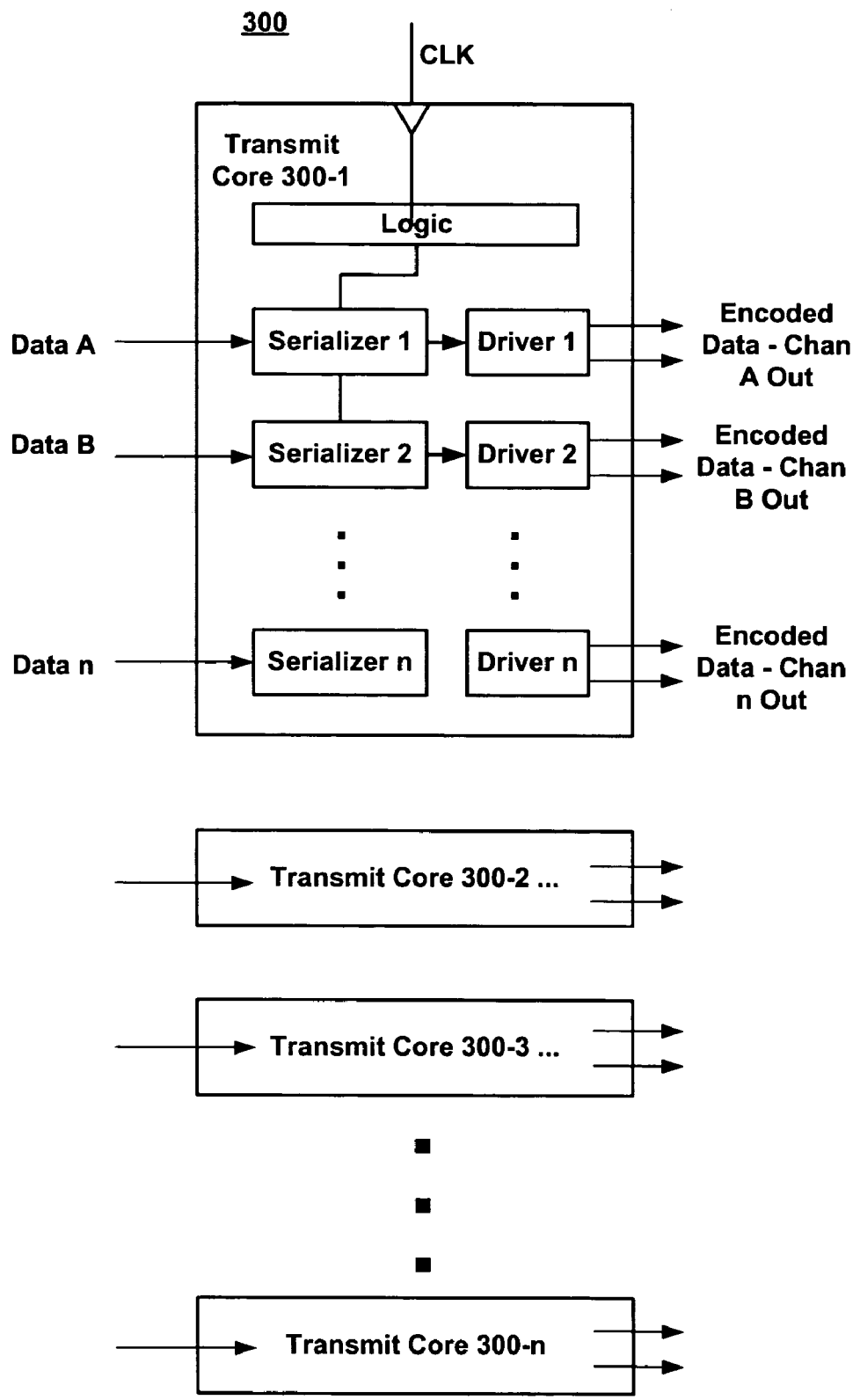
FIG. 3 is a block diagram of a transmit core in accordance with an exemplary implementation of a data communications architecture.
Figure 4:
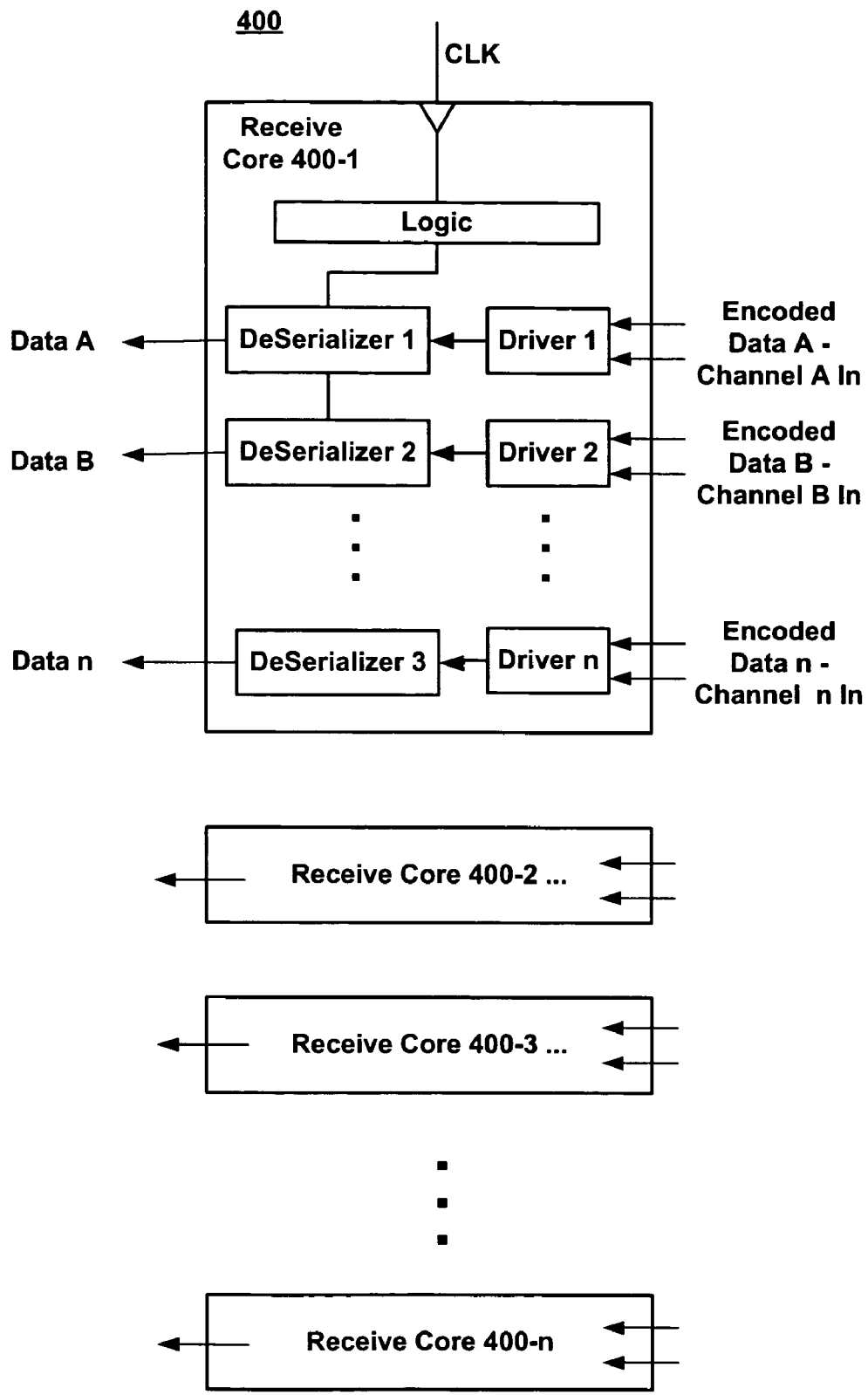
FIG. 4 is a block diagram of a receiving core in accordance with an exemplary implementation of a data communications architecture.

Data Communications Architecture:

FIGS. 2-4 depict block diagrams of an illustrative data communications architecture for use in an exemplary computing environment. The illustrative data communications architecture may be implemented as components of the computing environment and may employ SERDES components. Specifically, FIG. 2 shows a block diagram of illustrative data communications architecture 200. As is shown in FIG. 2, data communications architecture 200 comprises data communications interface cards 205 and 210 cooperating to communicate data 230 over physical links 220. Data interface communications cards 205 and 210 comprise at least one transmit core and at least one receiving core. Physical links 220 attach to data communications interface cards 205 and 210 through physical connectors 225.

In operation, exemplary computing environment (not shown) cooperates with data communications interface cards 205 and 210 to communicate data between data communications interface cards 205 and 210. In the illustrative implementation, data communication interface cards may reside in disparate geographic locations within exemplary computing environment (not shown) or may reside as part of one of exemplary computing environment's (not shown) printed circuit boards (PCB). As is shown, data may be communicated in a selected direction or bi-directionally, as indicated by the arrows on physical links 220 and data 230, between transmit cores and receiving cores of data communications interfaces 205 and 210. Also, it is appreciated that physical links 220 are depicted having differing line thickness to indicate different physical link 220 media.

Furthermore, as is shown, dashed box 215 shows the components of an exemplary data communications back plane. In the implementation provided, back plane 215 is shown to have a pair of transmit-receive cores operating to communicate data. Specifically, data is processed by transmit core 235 of data communications interface 205 for communication through physical connector 225 and physical links 220 to receiving core 245 of data communications interface 210. Similarly, data may be processed for communication by transmit core 250 of data communications interface 210 to receiving core 240 of data communications interface 205. Moreover, transmit-receiving core pairs 235, 240 and 245, 250 may cooperate to form a communications channel. As a communications channel the transmit-receive core pairs may be aligned and trained to process data according to a selected encoding protocol such as eight-bit-ten-bit (8b 10b) encoding.

Further, as is shown in FIG. 2, data 230 may comprise a number of packets. Specifically, data 230 may contain a header portion and data packet portion. The data packet portion may further contain small data packets. It is appreciated that in the illustrative implementation provided, a small packet may be considered a data packet that is smaller in size than a normal, full sized data packet. In operation, various data, control, training, and channel management information may be communicated over exemplary data communications architecture 200 as data 230.

FIG. 3 shows a block diagram of exemplary transmit core environment 300 depicting its components and their cooperation. As is shown in FIG. 3, exemplary transmit core environment 300 comprises a plurality of transmit cores ranging from transmit core 300-1 to transmit core 300-n. Transmit core 300-1 is shown to comprise logic block a plurality of serializers and drivers from serializer 1 to serializer n, and from driver 1 to driver n, respectively. Additionally, transmit core 300-1 cooperates with an external data communications component (not shown) to obtain clock signal CLK. Also, as is shown, transmit core 300-1 comprises logic which maintains instruction sets to instruct the components of transmit core 300-1 (e.g. serializer 1) to perform functions in accordance with data communications operations. The logic of transmit core 300-1 may also act to maintain one ore more modules and mechanisms for use during data communications operations including, but not limited to, a link training status monitor, a link training module, a monitoring module, data buffer, a link training module, a parity bit module, and a data transmission acknowledgement module.

In operation, data is provided as input to one of transmit core 300-1's serializers. The data is encoded according to a selected encoding protocol and is prepared for communication by one of the transmit core's drivers to a cooperating data communications component at one of the transmit core's output channels. The encoding protocol may employ CLK signal to encode a number of bits within a selected cycle(s) of the CLK signal. For example, Data A may be encoded by serializer 1 of transmit core 300-1 according to a selected encoding protocol and prepared for communication by driver 1 to produce Encoded Data at channel A output as per instructions provided by transmit core 300-1's logic. Similarly, Data B may be encoded by serializer 2 of transmit core 300-1 according to a selected encoding protocol and prepared for communication by driver 2 to produce Encoded Data at channel B. Such encoding process and data communication preparation is performed across the remaining serializers and drivers of transmit core 300-1 and the other transmit cores of transmit core environment 300.

FIG. 4 shows a block diagram of exemplary receiving core environment 400 depicting its components and their cooperation. As is shown in FIG. 4, exemplary receiving core 400 comprises a plurality of receiving cores ranging from receiving core 400-1 to receiving core 400-n. Receiving core 400-1 is shown to comprise logic block a plurality of deserializers and drivers from deserializer 1 to deserializer n, and from driver 1 to driver n, respectively. Additionally, receiving core 400-1 cooperates with an external data communications component (not shown) to obtain clock signal CLK. Also, as is shown, receiving core 400-1 comprises logic which maintains instruction sets to instruct the components of receiving core 400-1 (e.g. deserializer 1) to perform functions in accordance with data communications operations. The logic of receiving core 400-1 may also act to maintain one ore more modules and mechanisms for use during data communications operations including, but not limited to, a link training status monitor, a link training module, a monitoring module, data buffer, a link training module, a parity bit module, and a data transmission acknowledgement module.

In operation, encoded data is provided as input to one of receiving core 400-1's deserializers. The data is decoded according to a selected decoding protocol and is prepared for communication by one of the receiving core's drivers to a cooperating data communications component at one of the receiving core's deserializer's outputs. The decoding protocol may employ CLK signal to decode a number of bits within a selected cycle(s) of the CLK signal. For example, Encoded Data A may be decoded by deserializer 1 of receiving core 400-1 according to a selected decoding protocol and prepared for communication by driver 1 to produce Data A as per instructions provided by receiving core 400-1's logic. Similarly, Encoded Data B may be decoded by deserializer 2 of receiving core 400-1 according to a selected decoding protocol and prepared for communication by driver 2 to produce Data B. Such decoding process and data communication preparation is performed across the remaining deserializers and drivers of receiving core 400-1 and the other receiving cores of transmit core environment 400.

Taken together FIG. 3 and FIG. 4 describe an exemplary communications channel environment such that data is encoded for communication by one or more transmit cores for decoding and subsequent processing by one or more receiving cores. Although described as separate components, it is appreciated that transmit cores and receiving cores may reside on a single communications component (See data communications interface 205 of FIG. 2). Moreover, transmit cores and receiving cores may operate as pairs to form one or more bi-directional data communications channels.

Figure 5:
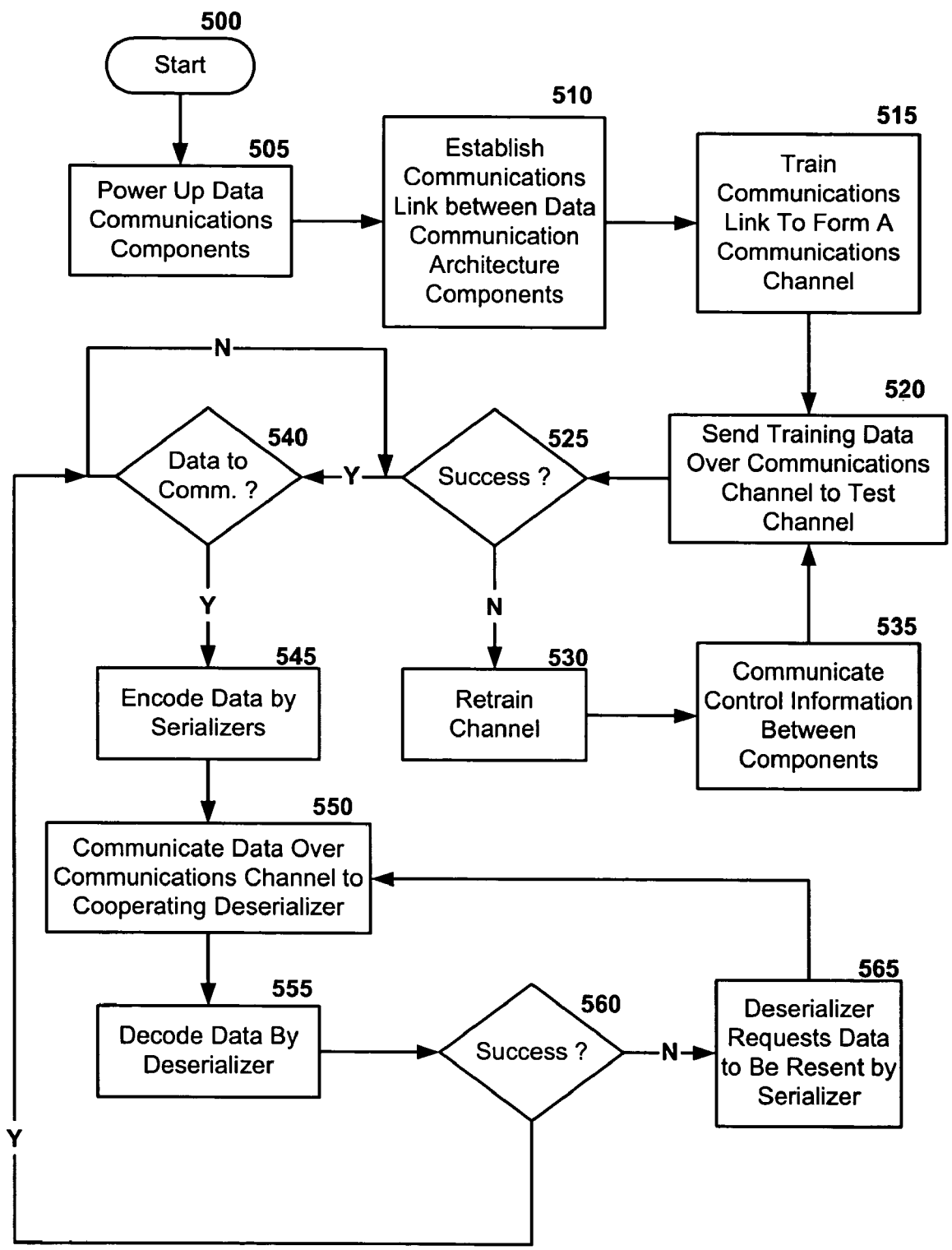
FIG. 5 is a flowchart diagram showing the processing performed by an exemplary data communications architecture when communicating data.

Communicating Data Across Communications Links:

FIG. 5 shows the processing performed by exemplary data communications architecture 200 when establishing a communications channel. As is shown, processing begins at block 500 and proceeds to block 505 where the communications components are powered up for operation. From there, processing proceeds to block 510 where communications links are established between the data communication architecture components. The communications links are then trained at block 515 to form a communications channel. Training data is then sent over the communications channel at block 520 to test the communications channel. A check is then performed at block 525 to determine if the communications channel test was successful. If it was successful, processing proceeds to block 540 where a check is performed to determine if there is data to communicate over the successfully tested communications channel. If at block 540 it is determined that there is no data to communicate, processing reverts to block 525. However, if there is data to communicate over the successfully tested and trained communications channel, processing proceeds to block 545 where the data is encoded by serializers. The encoded data is then communicated over the communications channel to cooperating deserializers at block 550. The data is then decoded by the deserializers at block 555. A check is then performed at block 560 to determine if the data was successfully communicated. If the data was successfully transmitted, processing reverts to block 540 and proceeds there from. However, if the data was not successfully communicated, processing proceeds to block 565 where the deserializers request the data to be resent by the serializers. From there processing reverts back to block 550 and proceeds there from.

However, if at block 525 it is determined that the communications channel test was not successful, processing proceeds to block 530 where the communications links are retrained. From there processing proceeds to block 535 where control information is communicated between the communications link components. From there, processing reverts to block 520 and proceeds there from.

In operation, the illustrative implementation, provides that the training sequence is governed by the deserializers of a communications link. Specifically, initial training is deemed completed upon the recognition of an indication of the writing of a selected software type register on the deserializer. At such time, data is driven onto the link by the serializers of the communications channel. In the context of deserializer operations, the deserializers maintain one or more instructions sets which direct the deserializers to detect activity on the link to signal cooperating serializers to begin initialization. The deserializers and serializers of the communications channels maintain at least one instruction set to direct the channels to power up. Upon successful power up, a per channel self test is performed from which the results are collected and compared. The instruction set then directs the serializers and deserializers to communicate a selected data pattern which is expected by the deserializers which allow the deserializers to determine bit units grouping for use by the encoding and decoding protocols utilized by the serializers and deserializers.

Additionally, a second recognizable data pattern is communicated to the deserializers which the deserializers attribute as the small packet data communications. By setting the small packet data communications the deserializers can operate to match small packets together in groupings consisted with how they were originally communicated. Once the second data pattern is successfully communicated and processed, a control signal is sent from the deserializers to the serializers of the communications links indicating that training has been completed. At this point data packets may be communicated across the trained channels.

Moreover, the illustrative implementation provides that should an error occur over the communications link, the link may perform a retraining process. Link retraining is similar to the above-described link training outside of foregoing the powering up the communication channel components. Retraining may be triggered by a number of events, including but not limited to, the recognition of an error across the communications link or by reception of an error signal on the link generated by the receiving end of the communications link.

Handling Data Communications Gaps (Data Arrival Timing):

The illustrative data communications architecture is capable of handling uncertain data arrival times between cooperating components. In the context of a SERDES data communications architecture, data extracted from the receiving end of a SERDES link may not be tightly synchronized to a local clock. Stated differently, in any given cycle of the local clock, the link may or may not have new valid data to present.

In the illustrative implementation, and as described above, data transactions are passed across the links in a "packet" format. Each packet is formed from one or more small packets, depending on the amount of information and the data that the transaction includes. A small packet may be considered a unit of payload that the link transfers during a given time period. A packet may comprise a header packet followed by some number of small data packets to fill out the transaction. The header might include information describing the type of packet, and other information to handle the packet, such as its destination address.

To traverse an exemplary computing environment's data communications infrastructure, it can be the case that a transaction passed across a SERDES link is routed to another SERDES link on the way to its final destination. In such context, a data transaction may take several cycles on the SERDES link to complete transfer of all of its small packets. Unwanted latency may result if a full transaction is buffered up before it is forwarded to the next communications link. Also, it might be the case that a link can fail its initial attempt to transmit part of a packet creating a long pause between the beginning and end of the packet. Furthermore, the frequency operation of different links may be different which can cause gaps in the flow of small packets onto a faster link if the data is coming from a slower link.

The illustrative data communications architecture handles such cases by providing a mechanism to allow correct operation of the SERDES link for this application in the presence of gaps in the flow of the small and normal sized packets. In operation, the SERDES link interface at the transmitting end of the link (See transmit core 235 of FIG. 2) utilizes a selected encoded or control value to be sent across the link if it does not have the next valid small packet for transmitting. Furthermore, the receiving end of the link (See receiving core 245 of FIG. 2) generates an outgoing control small packet when it does not find newly received data at its link interface at the beginning of its clock cycle or if it finds an encoded small packet. Control small packets are ignored during data processing.

Figure 6:
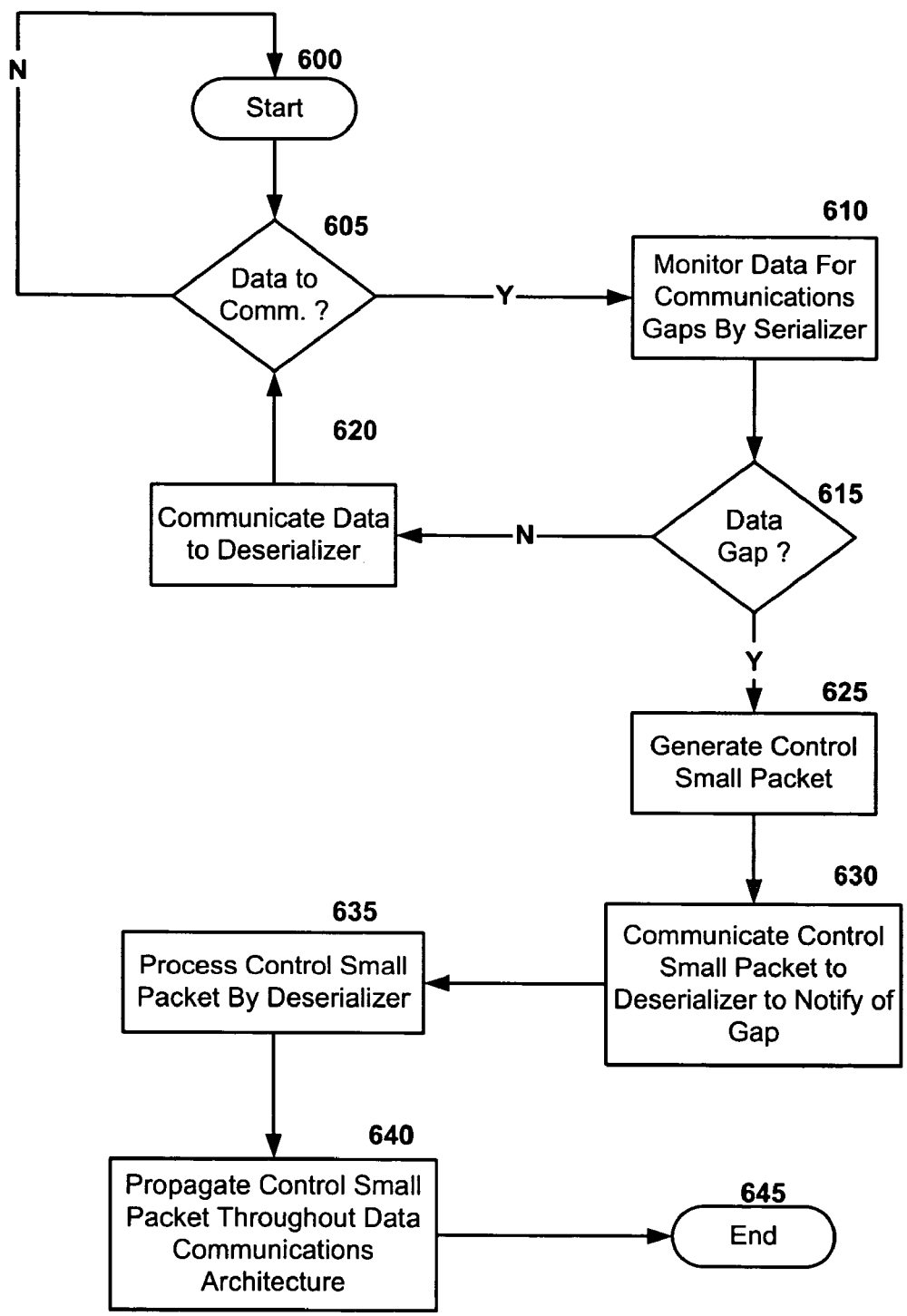
FIG. 6 is a flowchart diagram showing the processing performed by an exemplary data communications architecture when handling uncertain data arrival.

FIG. 6 shows a the processing performed when handling data communications gaps for data being communicated across exemplary data communications architecture 200 of FIG. 2. As is shown, processing begins at block 600 and proceeds to block 605 where a check is performed to determine if there is data to communicate across the communication channels of the exemplary data communications architecture. If there is no data to communicate, processing reverts to block 600 and proceeds there from. However, if there is data to communicate, processing proceeds to block 610 where the data to be communicated is monitored for communications gaps. In operation, data may be buffered in a data buffer prior to being encoded by a serializer of the data communications architecture. It is in the data buffer that data is processed for gaps. A check is then performed at block 615 to determine if there was a data communications gap. If there is no data communications gaps, processing proceeds to block 620 where the data is communicated by the serializer to a cooperating deserializer. Form there processing proceeds to block 605 and proceeds there from.

However, if at block 615 it is determined that there is a data gap processing proceeds to block 625 where a control small packet is generated. The control small packet is then communicated to the cooperating deserializer at block 630 to notify the cooperating deserializer of the communications gap. The deserializer processes the control small packet at block 635 and propagates the control small packet throughout the data communications architecture at block 640. Processing then terminates at block 645.

Error Detection:

Exemplary data communications architecture 200 of FIG. 2 is also capable of performing error detection on the data that is being communicated between its components. In the context of a SERDES data communications architecture, the retrying of data transfers may be necessary to communicate data that fail to accurately pass across the link. To retry a transmission, an error is first detected. The error is detectable to properly identify the first small packet that is retried to continue with data communications operations.

In the implementation provided, the encoding standard that may be used to format data for a SERDES link may be designed to follow electrical characteristics required for the SERDES link to be able to transmit data at high frequencies it utilizes. Additionally, enough transitions may be performed on the channel such that a clock can be extracted from the bit stream at the receiving end of the link. Furthermore, for the bit pattern may have a neutral disparity. Stated differently, any time the number of ones and zeros transmitted might be equal, or at most differ by one. The exemplary encoding protocol operates such that single bit errors will result in illegal encoding. It might be the case, however, that in some instances, the illegal encoding may look legal but generate the wrong expected disparity. When the error is of this type, the error will not be detected until the subsequent data patterns push the disparity at the receiving end of the link to +/−2.

In SERDES data communications architecture, a single link may operate to pass large volumes of information quickly across its channel. As such, errors may be bounded by sending special "end packet" control characters on the link. These would ensure that an error was recognized before the data block was released. This approach adds the overhead of needing to send the special control character and may provide inefficiencies in the data communications process adding latency. In practice, it might take one encoding cycle to send a control character. It is appreciated that for a data communications architecture having a plurality of SERDES links, a significant amount of time would be required to process control characters leading to substantial inefficiencies in data communications.

The illustrative implementation provides an alternate approach where the data communications architecture recognizes that the encoding standard's first symptom of error can be determined by the a comparison of the receiving end (see receiving core 245 of data communications interface 210 of FIG. 2) and transmitting end (see transmit core 235 of data communications interface 205 of FIG. 2) disparity of the data being communicated. If the disparity used to transmit the data is known at the receiver, an error could be detected immediately. To achieve this, the disparity of the links used to send a small packet are gathered up and used to generate a five bit error code. This five bit value is then passed to the receiving end of the link. In the illustrative implementation, such error code may be communicated to the receiving end of the link using one additional SERDES link channel. This value can then be used on the receiving end of the link to check the disparities at the receiving end of the link, and to immediately request a resending of data from the transmitting end of the communications channel if the disparities are not the expected values.

In operation, the illustrative implementation employs a five-bit to ten-bit encoding when communicating the error code. The five bits are sent twice, once as positive true, and once as negative true. In this way, the ten bit pattern will include five ones and five zeros, achieving neutral disparity. Such processing is also efficient so that system timing can be maintained when using a 10 bit encoding scheme.

Additionally, the illustrative implementation provides that upon the completion of link training, data is communicable across the link. The data may comprise a header, small data packets, should they be available for communication, or control information such as small link management data packets. This data, regardless of type, when encoded produces a pattern of 1's and 0's having an associated disparity.

Figure 7:
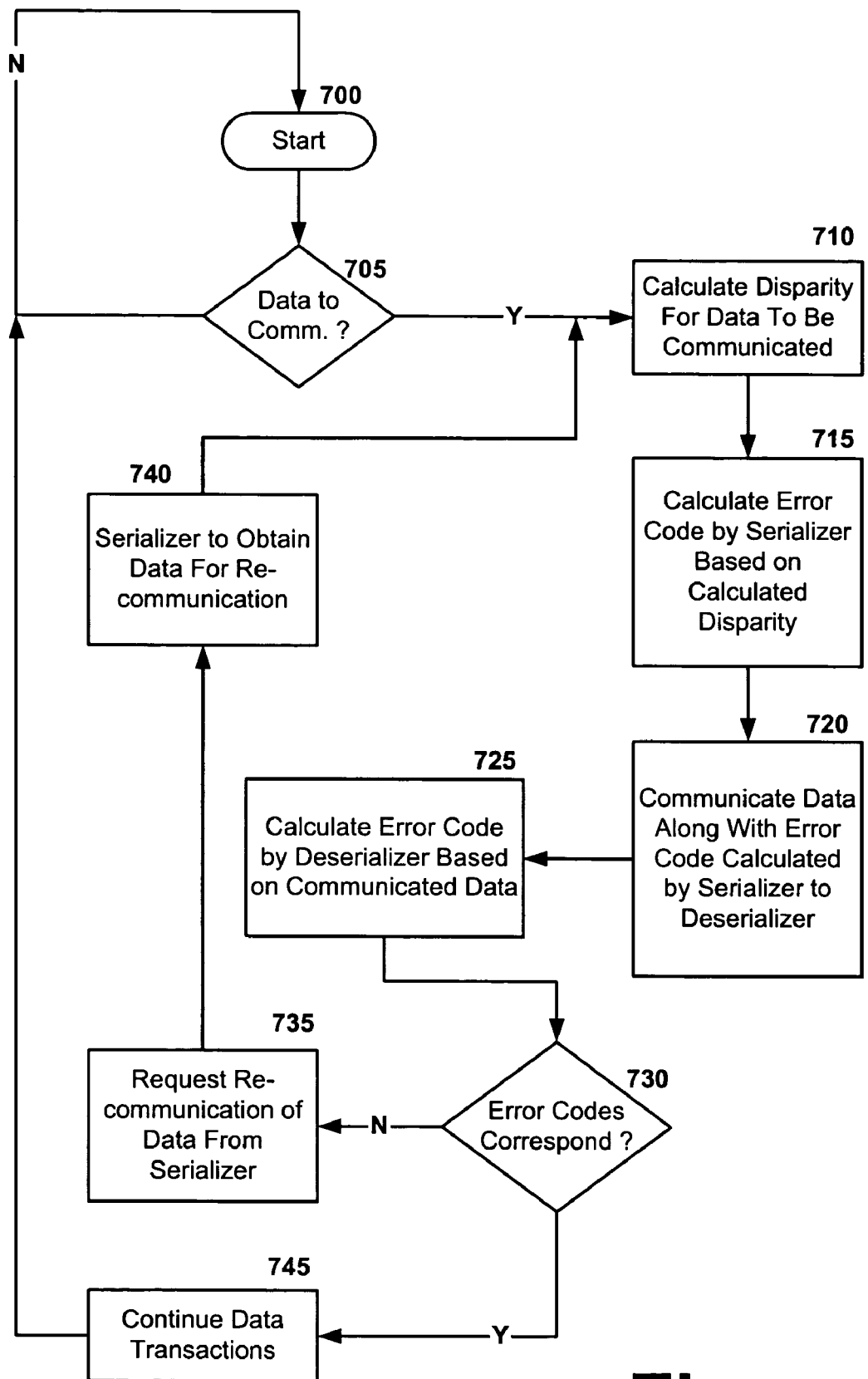
FIG. 7 is a flowchart diagram showing the processing performed by an exemplary data communications architecture when detecting bit errors in data communications.

FIG. 7 shows the processing performed by exemplary data communications architecture 200 when performing error detection. As is shown, processing begins at block 700 and proceeds to block 705 where a check is performed to determine if data is to be communicated across the components of exemplary data communications architecture 200 of FIG. 2. If the check at block 705 yields the determination that data is not to be communicated, processing reverts back to block 700 and proceeds there from. However, if at block 705 it is determined that data is to be communicated, processing proceeds to block 710 where the disparity for the data to be communicated is calculated. From there an error code for the data to be communicated is calculate using the calculated disparities by the serializer at block 715. The data along with the calculated error code are then communicated by the serializer to a cooperating deserializer at block 720. The deserializer receives the data and calculates the error code based on the communicated data at block 725. From there, a check is performed to determine if the error codes correspond at block 730. If the error codes do not correspond at block 730, processing proceeds to block 735 where a request to re-communicate the data is sent by the deserializer to the serializer. The serializer obtains the data for re-communication at block 740 and processing reverts to block 710 and proceeds there from.

However, if at block 730 it is determined that that the error codes generated by calculated by the serializer and the deserializer, respectively, do correspond, processing proceeds to block 745 where data transactions are continued. From there processing reverts to block 700 and proceeds there from.

Link Failures:

Exemplary data communications architecture 200 is also capable of handling link failures if the links fail during operation. The illustrative implementation operates to allow connection with the exemplary computing environment's infrastructure to remain active when a link fails and not force the computing environment to become unstable (e.g. crash).

In the context of a SERDES data communications architecture, the point to point connections in the computer's infrastructure may be composed of several SERDES links operating in concert to provide increased data communications bandwidth. The illustrative implementation provides for the use of one additional SERDES link to be deployed over a "spare" link channel in the event that one of the other communications links have failed. Moreover, the illustrative implementation may detect that a link channel is not reliable and not use it. The implementation also provides a protocol by which the receiving end (see receiving core 245 of data communications interface 210 of FIG. 2) of the link can communicate with the transmitting end (see transmit core 235 of data communications interface 205 of FIG. 2) of the link which link channel should not be used. In operation, the illustrative implementation determines that a link has failed during the link training sequence. Link training will occur in response to a detected error on the normal transmission of data, or on initial link bring up. Recognition that a link has failed includes, among other events, loss of the presence detect signal for that link; failure of that link to pass link self test; failure of that link to signal proper alignment.

In response to a link failing, logic on the receiving end of the link will shift logical link channels from the failing link to the last numbered link away from the failing physical link. Additionally, a new mapping is encoded in a 5-bit field and returned to the sending end of the link. There the new mapping is used to program the transmit logic to drive the links in the next training attempt onto the proper physical channels.

Figure 8:
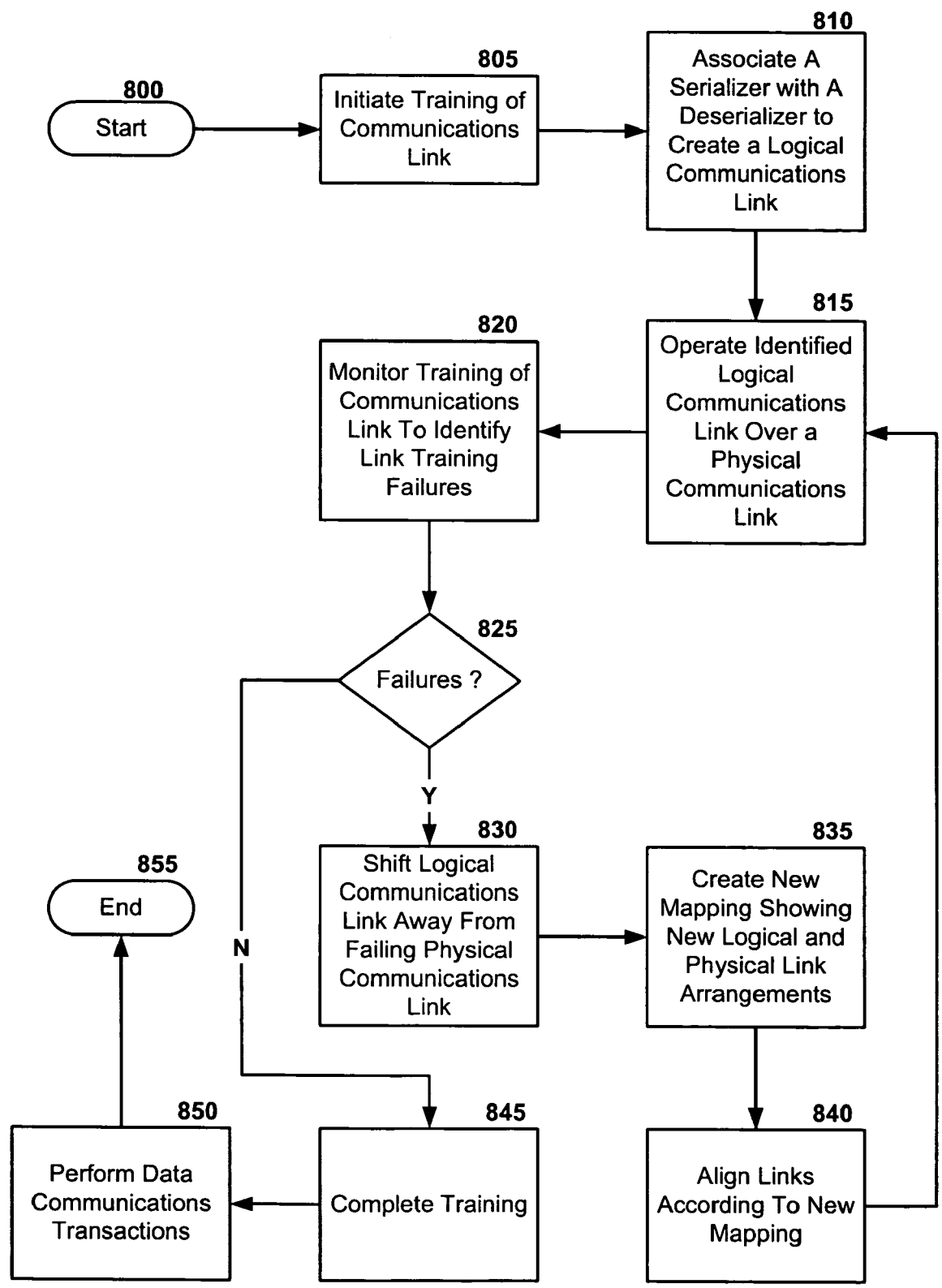
FIG. 8 is a flowchart diagram showing the processing performed by an exemplary data communications architecture when addressing a link failure.

FIG. 8 shows the processing performed by exemplary data communications architecture 200 when handling a link failure. As is shown, processing begins at block 800 and proceeds to block 805 where data communications architecture initiates training of the communications link. From there a serializer and deserializer of data communications architecture 200 are associated to create a logical communications link at block 810. The created logical communications link is then operated over a physical communications link at block 815. From there, processing proceeds to block 820 where the training of the communications link is monitored to identify any link failures. A check is then performed at block 825 to determine if there are failures on the link. If there are no failures as determined by the check at block 825, processing proceeds to block 845 where the training of the link is completed. Data communications transactions are then performed on the trained link at block 850. Processing then terminates at block 855.

However, if at block 825 it is determined that a link failure has occurred, processing proceeds to block 830 where the logical communications link is shifted away from the failing physical communications link. A new mapping providing new logical and physical communication link arrangements is created at block 835 and the logical and physical communication links are aligned according to the new mapping at block 840. From there, processing reverts to block 815 to retest the newly mapped channels for proper operation. From there processing continues as shown.

It is appreciated that after a selected number of failing attempts, a signal will be sent across the cooperating components of data communications architecture 200 to indicate that the link has failed. In such context, the link is not utilized for data communications transactions.

Training and Failed Training:

Exemplary data communications architecture 200 is also capable of handling retraining of failed links. In the context of SERDES data communications architectures, the illustrative implementation employs a plurality of many SERDES links used together to provide high bandwidth and low latency. In practice, before the SERDES links can be used to transfer data, they are first "trained" by sending appropriate known data sequences which the receiving end of the link can use to properly align the links. Additionally, training also affords an opportunity to test that the links transmit other known data sequences accurately. Under some circumstances the link training may fail during a first attempt and be successful during a second attempt. In this context, the illustrative implementation operates to communicate from the transmitting end of the communications channel (see transmit core 235 of data communications interface 205 of FIG. 2) to the receiving end (see receiving core 245 of data communications interface 210 of FIG. 2) of the communications channel information that can enable training to be successful during a second attempt.

The illustrative implementation further provides a mechanism to pass information across the link when link training has failed. In operation, data sequences to test the links are formatted before they are presented on the encoder in such a way that the same bit encoding will be generated regardless of the previous disparity of the encoding scheme, i.e. neutral disparity.

On the receiving end of the link, the data from the SERDES interface is a static bit received pattern, since the data is formatted to maintain a neutral disparity. As such, even though the alignment between the links and each other of the receive logics clocks is not guaranteed, the provided data can be treated as a static value. Furthermore, in operation, the illustrative implementation provides that copies of the data sequences are compared to each other on the receiving end of the communications link to disqualify any one link that my be bad. Moreover, the information may then be used to reprogram each end of the link to change how the data is expected to arrive in order to retrain around any defect.

Figure 9:
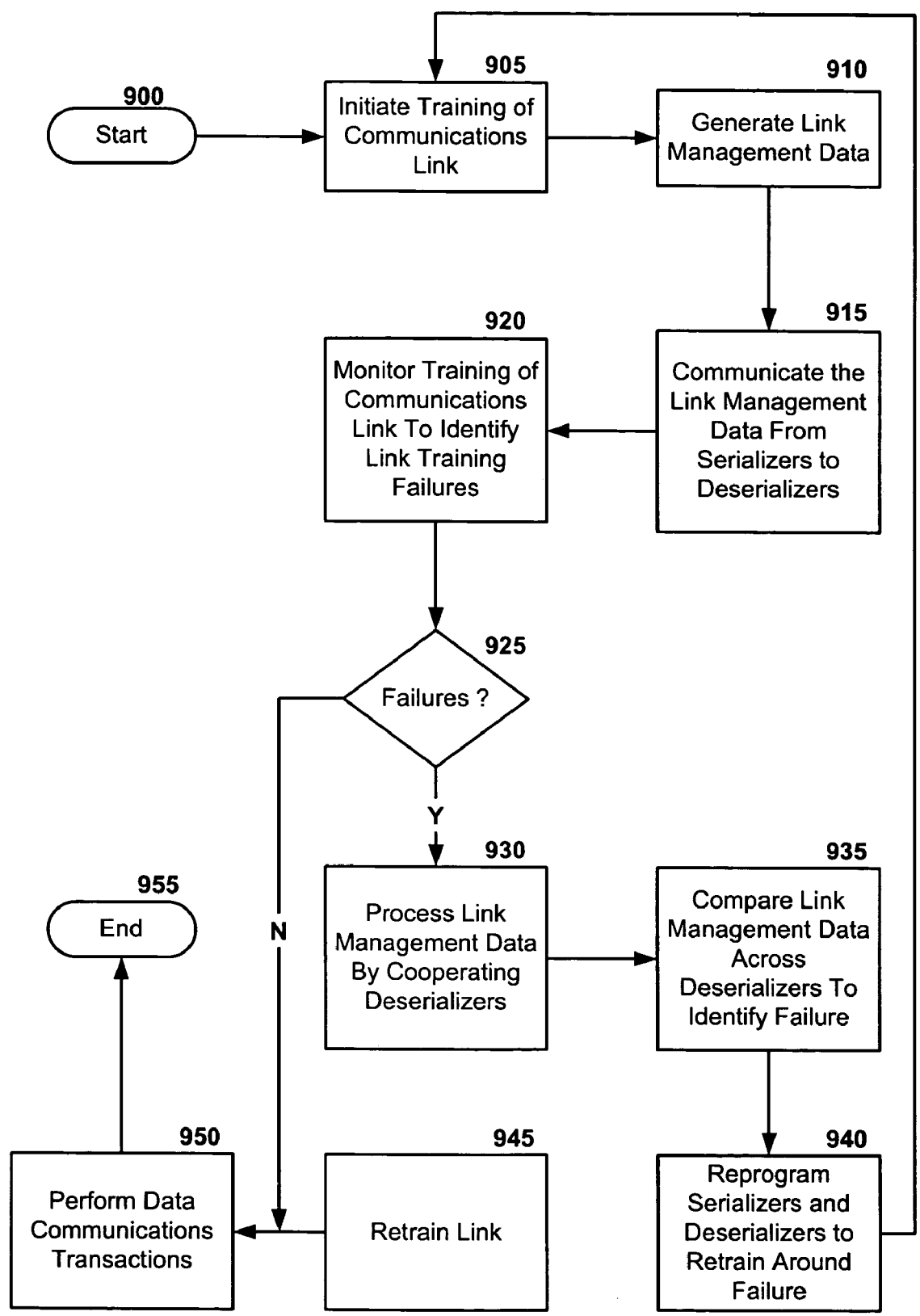
FIG. 9 is a flowchart diagram showing the processing performed by an exemplary data communications architecture when addressing link failure training.

FIG. 9 shows the processing performed by exemplary data communications architecture 200 when handling link training failures. As is shown, processing begins at block 900 and proceeds to block 905 where exemplary data communications architecture initiates training of the communications link. From there processing proceeds to block 910 where link management data is generated. The link management data is then communicated across the link management from the serializers and deserializers at block 915. The training is monitored at block 920 to identify link training failures. A check is then performed at block 925 to determine if there were any link training failures. If there are no link training failures, processing proceeds to block 950 where data communications transactions are performed. From there, processing terminates at block 955.

However, if at block 925, it is determined that there are link training failures, processing proceeds to block 930 where the link management data is processed by the deserializers. The link management data is then compared across the cooperating deserializers to identify training failures at block 935. The serializers and deserializers are then reprogrammed to retrain around the link training failure at block 940. From there processing reverts to block 905 and continues as shown.

It is appreciated that after a selected number of failures as determined at block 925, a determination is made that the link is failed and will not be used for data communications transactions. In this context, additional processing as described by FIG. 8 may be performed to re-map the logical and physical channels.

Handling Corrupt Data:

Exemplary data communications architecture 200 is also capable of identifying and marking data as corrupt to increase data communications architecture robustness. In the context of SERDES data communications architectures, the illustrative implementation provides a mechanism to recognize when data is not successfully transmitted across the link and marks such data corrupt. This may occur when the small data packet is corrupted before it is transmitted. The illustrative implementation operates to allow the failing data to be accepted, so the link can proceed to transmitting data behind the failing small data packet. Furthermore, the failing small data packet is marked as corrupt and sent to its destination.

Furthermore, the illustrative implementation allows for a link to accept a small data packet marked as corrupt and to complete any transaction that is in progress when the link it is currently traversing fails. This is accomplished by sending manufactured data to fill out the transaction, and marking the entire data, partial and filler, as corrupt. In doing so, partially transmitted transactions are prevented from clogging other link interfaces, enabling the infrastructure to contain the failure to processes that were actively using the failed link.

Figure 10:
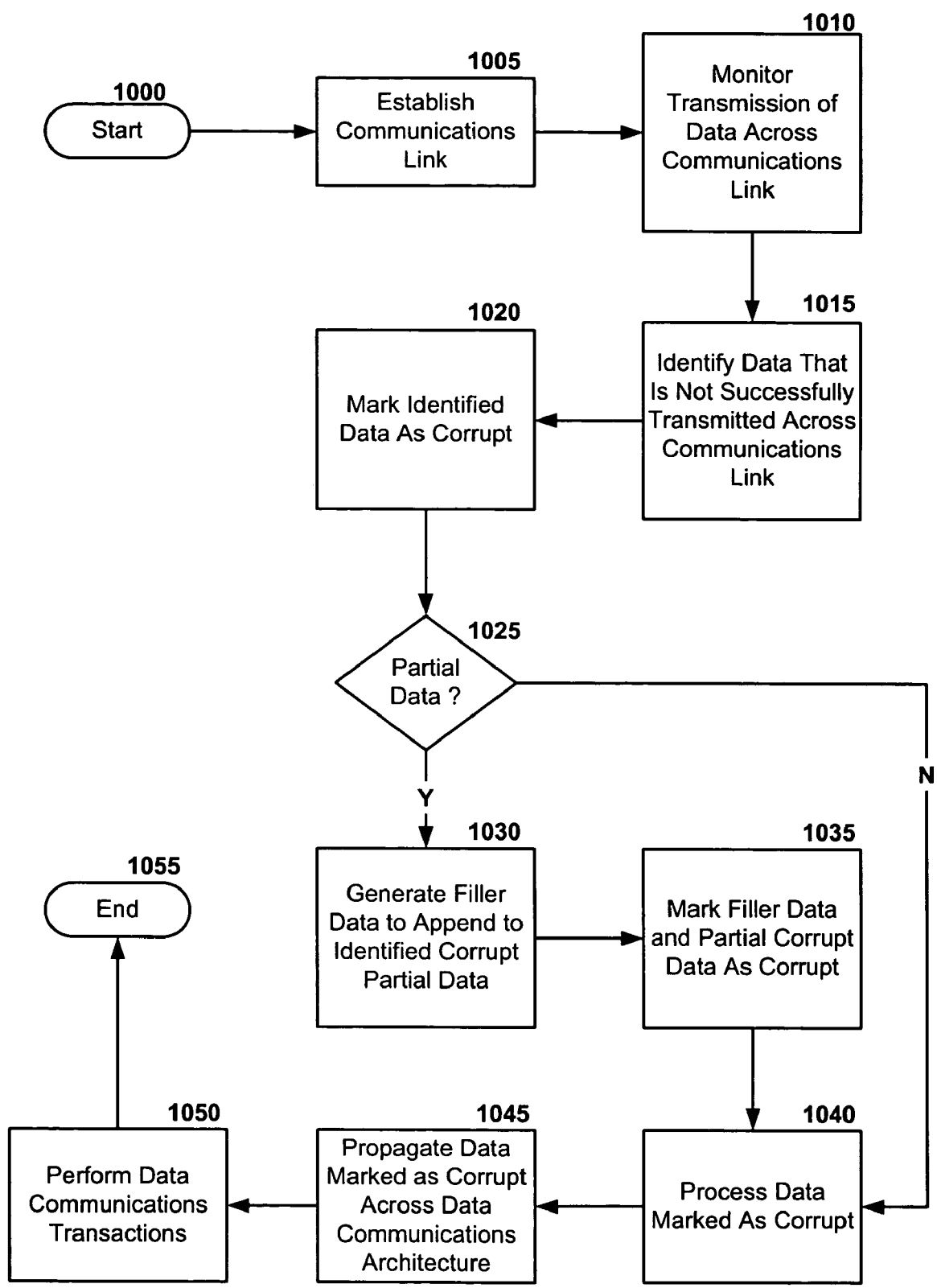
FIG. 10 is a flowchart diagram showing the processing performed by an exemplary data communications architecture when addressing corrupted data.

FIG. 10 shows the processing performed when identifying and marking data as corrupt during data communications transactions. As is shown, processing begins at block 1000 and proceeds to block 1005 where a communications link is established between cooperating components of the exemplary data communications architecture 200. From there, processing proceeds to block 1010 where data transmission across the established communication link is monitored. Data which is not successfully transmitted across the communications link is identified at bock 1015. The identified unsuccessfully transmitted data is marked as corrupt at block 1020. From there a check is performed at block 1025 to determine if the corrupt data contains partial data. If the check at block 1025 yields that there is no partial data, processing proceeds to block 1040 where the data marked as corrupt is processed by the components of the data communications architecture. From there, the data marked as corrupt is propagated across the data communications architecture at block 1045. Data communications transactions are then performed at block 1050. Processing then terminates at block 1055.

If, however, at block 1025 it is determined that there is partial data, processing proceeds to block 1030 where filler data is generated to append to the partial corrupt data. The filler data and partial corrupt data are then marked collectively as one piece of corrupt data at block 1035. From there processing proceeds to block 1040 and continues there from.

Additionally, the illustrative implementation provides that the data is identified as corrupt as a result of one or more iterations of successful attempts of communications link training. Stated differently, if the communications link can ultimately be successfully trained, but the transmission of specific small data packet repeatedly fails, the problem is determined to be a problem with the data.

Error Codes for use in Error Detection:

Exemplary data communications architecture 200 of FIG. 2 is also capable of detecting errors efficiently across a plurality of is communications channels without performing extensive processing. In the context of a SERDES data communications architecture, the illustrative implementation provides an error encoding that operates using the encoding protocol of the data communications architecture.

In operation, transactions (or data packets) are passed across a collection of several link channels in units called small data packets, each transaction requiring a number of small data packets according to its size. Each small data packet includes a number (e.g. 8) logical bits per channel that are transmitted in a numbered (e.g. 10) bit encoding protocol. This error detection scheme operates on one small data packet at a time. In practice, the standard 8b10b encoding used per channel is capable of detecting single bit errors within one channel. This detection is combined with logic to calculate eight parity bits across the channels carrying the small data packet. The parity bit is based off the 1, 2, 3, . . . $8^{th}$ bit of the 8 bits of data sent on the channel. These 8 parity bits are then used as the data to be transmitted across one additional link channel. Errors may be detected by calculating the parity bits for the data transmitted over a communications channel on the receiving end.

Figure 11:
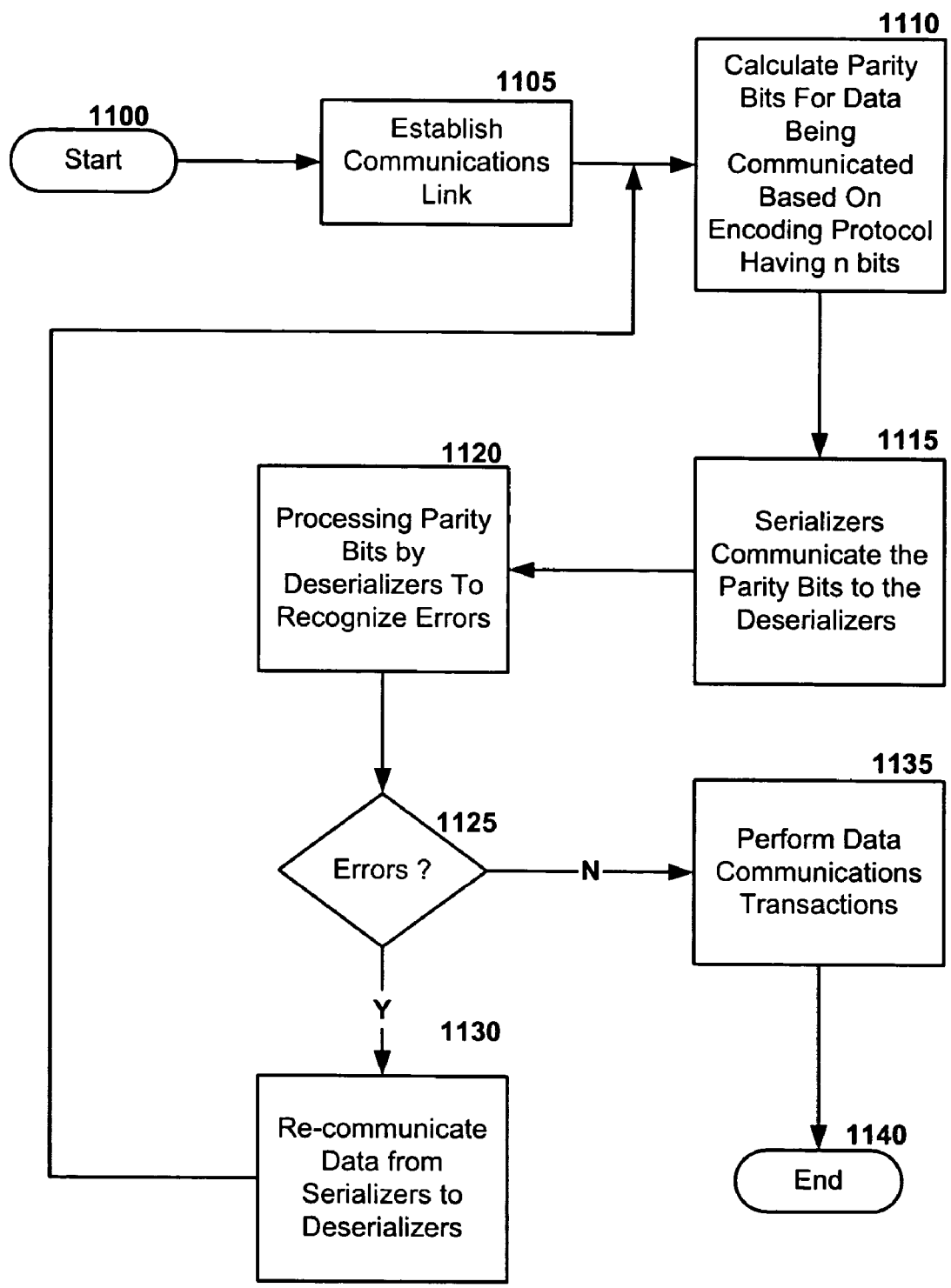
FIG. 11 is a flowchart diagram showing the processing performed by an exemplary data communications architecture when handling error detection.

FIG. 11 shows the processing performed by exemplary data communications architecture 200 when detecting errors across a plurality of communications channels. As is shown, processing begins at block 1100 and proceeds to block 1105 where a communications link is established between components of exemplary data communications architecture 200. From there, processing proceeds to block 1110 where parity bits are calculate for data being communicated based on the encoding protocol having n bits. The parity bits are then communicated across the communications link at block 1115 from the serializers to the deserializers. The parity bits are then processed by the deserializers at block 1120. A check is then performed at block 1125 to determine if any errors were identified using the parity bits. If there are were no error identified at block 1125, processing proceeds to block 1135 where data communications transactions are performed. Processing then terminates at block 1140.

However, if at block 1125, it is determined that here are errors identified, processing proceeds to block 1130 where the data is re-communicated from the serializer to the deserializer. From there processing reverts to block 1110 and continues as shown.

It is appreciated that after a number of attempts to re-communicate the data from the serializer to the deserializer and the errors continue to be identified then such data may be marked as corrupt as per the processing described above in FIG. 10.

Link Level Retry:

Exemplary data communications architecture 200 of FIG. 2 is also capable of acknowledging successful transfer of data between its components. In the context of a SERDES data communications architecture, transactions may be passed across the links in "packet" format. A packet may be formed from one or more small packets depending on the amount of information and data that the transaction includes. A small data packet may be considered as the unit of payload that the link is designed to transfer at a time. The packet may comprise a header small packet followed by some number of small data packets to fill out the transaction. The header, among other things, may include information describing the type of packet, and other information to handle the packet, such as its destination address.

In order to achieve the capability of resending, or retrying the transfer of small data packets across the link, the illustrative implementation holds substantially all small header and data packets transferred across the link in a data buffer until such a time as an acknowledgement signal is received from the opposite end of the link. Once acknowledgement of a successful transfer has been received, the data buffer entry containing that small header and data packet can be released to be used by another small data packet. In the implementation provided, generally no more small and header data packets can be sent across the link than there are link level retry buffer entries to hold them. If there is a failure to properly transfer a small data packet across the link then the first small header and data packet to be resent across the link is the oldest small data packet within the data buffer that has not been acknowledged.

The illustrative implementation provides a mechanism and protocol that achieve the acknowledgement of a successful transfer of a small data packet. In practice, the small data packet transferred across the link has a tag associated with it that matches the entry address of the data buffer where the small data packet is being stored. The header small packet contains a field reserved for successful transfer acknowledgement. When a header is sent out across the link, this field is filled with the address of the last small data packet successfully received at that time. When sending the address, if an acknowledgement is lost, the next acknowledgement will self correct the mechanism.

In the instance there is no valid header ready to carry the address acknowledgement across the link, the illustrative implementation creates an idle header to carry the acknowledgement back across the link.

Lastly, after a link transfer failure has been corrected, but before normal operation is restarted, the address of the most recently successfully received small data packet is sent as a part of the link restart sequence to ensure that successfully received small data packets are appropriately acknowledged.

Figure 12:
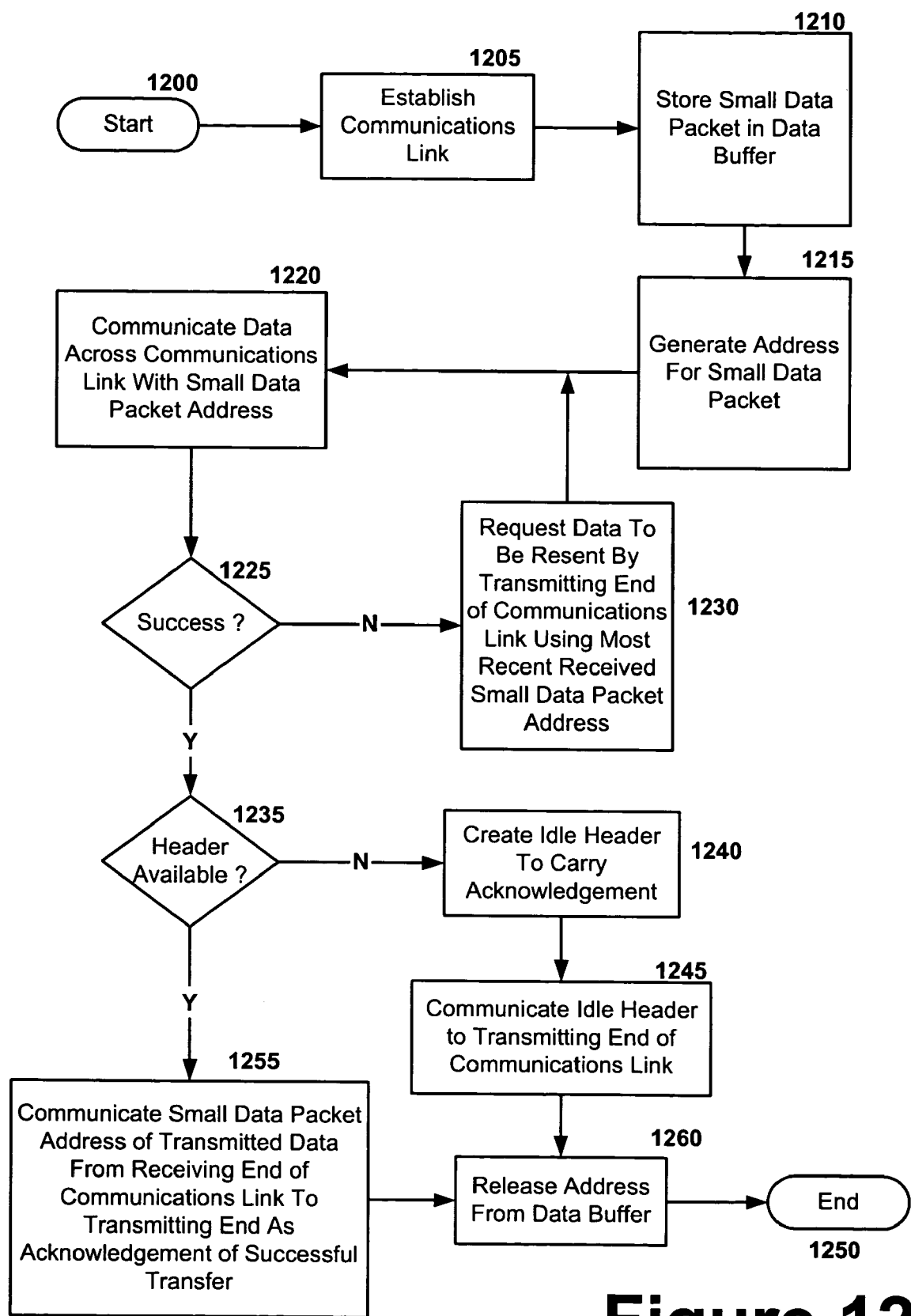
FIG. 12 is a flowchart diagram showing the processing performed by an exemplary data communications architecture to acknowledge successful data communications.

FIG. 12 shows the processing performed by exemplary data communications architecture 200 of FIG. 2 when creating and transacting acknowledgements for successful data communications. As is shown, processing begins at block 1200 and proceeds to block 1205 where a communications link is established between cooperating components of data communications architecture 200 of FIG. 2. Small data packets are then stored in a cooperating data buffer at block 1210. From there processing proceeds to block 1215 where an address is generated for the small data packet. The data with the small data packet address are then communicated from a transmitting serializer at block 1220. A check is then performed at block 1225 to determine if the data was properly communicated to receiving deserializer. If the check at block 1225 indicates that the data was not properly communicated, processing proceeds to block 1230 where the data is requested to be resent by the transmitting end of communications link using most recent received small data packet address. From there processing reverts to block 1220 and continues as shown.

However, if at block 1225, it is determined that the data was properly communicated processing proceeds to block 1235 where a check is performed to determine if a header is available to carry the acknowledgement from receiving end of the communications link to the transmitting end of the communications link. A time delay might occur before the acknowledgement is prepared as the small data packets are first sent to complete current outgoing packets. If the check at block 1235 indicates that there is a header available, processing proceeds to block 1255 where the small data packet address is communicated from the receiving end of the communications channel to the transmitting end of the communications channel as acknowledgement of a successful transfer using the available header. Processing proceeds to block 1260 where the small data packet address is released from the cooperating data buffer. Processing then terminates at block 1250.

If, however, at block 1235 it is determined that there is no header available, an idle header is created to carry the acknowledgement of a successful transfer at block 1240. The idle header is communicated from the receiving end of the communications link to the transmitting end of the communications link at block 1245. Processing once gain proceeds to block 1260 where the small data packet address is released from the cooperating data buffer. Processing then terminates at block 1250.

In sum, the herein described apparatus and methods provide a data communication architecture employing for use as a computing environments communication fabric that reduces data latency. It is understood, however, that the invention is susceptible to various modifications and alternative constructions. There is no intention to limit the invention to the specific constructions described herein. On the contrary, the invention is intended to cover all modifications, alternative constructions, and equivalents falling within the scope and spirit of the invention.

It should also be noted that the present invention may be implemented in a variety of computer environments (including both non-wireless and wireless computer environments), partial computing environments, and real world environments. The various techniques described herein may be implemented in hardware or software, or a combination of both. Preferably, the techniques are implemented in computing environments maintaining programmable computers that include a processor, a storage medium readable by the processor (including volatile and non-volatile memory and/or storage elements), at least one input device, and at least one output device. Computing hardware logic cooperating with various instructions sets are applied to data to perform the functions described above and to generate output information. The output information is applied to one or more output devices. Programs used by the exemplary computing hardware may be preferably implemented in various programming languages, including high level procedural or object oriented programming language to communicate with a computer system. Illustratively the herein described apparatus and methods may be implemented in assembly or machine language, if desired. In any case, the language may be a compiled or interpreted language. Each such computer program is preferably stored on a storage medium or device (e.g., ROM or magnetic disk) that is readable by a general or special purpose programmable computer for configuring and operating the computer when the storage medium or device is read by the computer to perform the procedures described above. The apparatus may also be considered to be implemented as a computer-readable storage medium, configured with a computer program, where the storage medium so configured causes a computer to operate in a specific and predefined manner.

Although an exemplary implementation of the invention has been described in detail above, those skilled in the art will readily appreciate that many additional modifications are possible in the exemplary embodiments without materially departing from the novel teachings and advantages of the invention. Accordingly, these and all such modifications are intended to be included within the scope of this invention. The invention may be better defined by the following exemplary claims.

What is claimed is:

1. In a computer system having a data communications architecture employing serializers and deserializers, a method to detect one or more errors in data communicated from the serializers to the deserializers and to resend the data in which the errors were detected, the method comprising:
    establishing a select number of operatively coupled communication channels between the serializers and the deserializers, each communication channel comprising its own serializer and deserializer;
    iteratively serializing a separate data packet in each serializer corresponding to each channel;
    for each bit position of each of the serialized data packets corresponding to each channel, calculating a parity bit for the bits of the serialized data packets having a corresponding bit position;
    encoding the serialized data packets in accordance with an encoding protocol providing error detection;
    communicating the encoded data packets from the serializers to the deserializers over the coupled channels, and communicating the calculated parity bits over an additional channel;
    detecting one or more errors in the communicated data using one or more of the parity bits in conjunction with the error detection provided by the encoding protocol; and
    re-communicating the data in which the errors were detected from the serializers to the deserializers.

2. The method as recited in claim 1 further comprising recognizing single bit and/or multi-bit errors in the data being communicated using the communicated parity bits.

3. The method as recited in claim 1 wherein:
    the number of data bits in each packet is eight; and
    the encoding protocol providing error detection is an 8b10b encoding protocol.

4. The method as recited in claim 1 wherein
    the number of coupled communication channels is nineteen.

5. The method as recited in claim 1 wherein the parity bits are calculated based on values derived from the data intended for communication over the communications channels.

6. The method as recited in claim 1 further comprising calculating parity bits by the deserializers upon receiving data from the serializers.

7. A computer readable medium having computer readable instructions to instruct a computer to perform a method to detect one or more errors in data communicated from serializers to deserializers and to resend the data in which the errors were detected, the method comprising:
    establishing a select number of operatively coupled communication channels between the serializers and the deserializers, each communication channel comprising its own serializer and deserializer;
    iteratively serializing a separate data packet in each serializer corresponding to each channel;
    for each bit position of each of the serialized data packets corresponding to each channel, calculating a parity bit for the bits of the serialized data packets having a corresponding bit position;
    encoding the serialized data packets in accordance with an encoding protocol providing error detection;
    communicating the encoded data packets from the serializers to the deserializers over the coupled channels, and communicating the calculated parity bits over an additional channel;
    detecting one or more errors in the communicated data using one or more of the parity bits in conjunction with the error detection provided by the encoding protocol; and
    re-communicating the data in which the errors were detected from the serializers to the deserializers.

8. A system for error detection in a data communications architecture having serializers and deseriatizers comprising:
    a select number of operatively coupled communication channels established between the serializers and the deserializers, the channels for communicating data packets in accordance with an encoding protocol providing error detection;
    a parity bit module communicatively connected to the serializers for calculating a parity bit for each bit position of corresponding bits of each of the serialized data packets being communicated corresponding to each channel; and
    an instruction set operatively associated with the serializers and the deserializers for providing instructions to the serializers and the deserializers to detect errors in communicated data using the communicated parity bits and resend the data in which errors are detected.

9. The system as recited in claim 8 further comprising a second parity bit module communicatively connected to the deserializers for calculating a parity bit for each bit position of corresponding bits of each of the communicated serialized data packets corresponding to each channel.

10. The system as recited in claim 9 wherein the deserializers detect errors in the received data and provide a control signal to the serializers to re-send the data in which errors are detected.

11. The system as recited in claim 8 wherein the deserializers cooperating with the parity bit module are capable of recognizing single bit and multi-bit errors.

12. The system as recited in claim 11 wherein the deserializers cooperating with the second parity bit module identify at least one channel having errant data.

13. A mechanism to handle errors in data communications over a SERDES data communications architecture comprising:

first means for establishing a select number of coupled communications channels for the communication of data between serializers and deserializers for iteratively communicating data packets in accordance with an encoding protocol providing error detection, each communication channel comprising its own serializer and deserializer;

second means operatively associated with the coupled communications channels for calculating a parity bit for each bit position of corresponding bits of each of the serialized data packets corresponding to each channel; and third means for detecting one or more errors in communicated data using one or more of the calculated parity bits and resending the data in which errors were detected.

14. The mechanism as recited in claim 13 wherein the encoding protocol is an 8b10b protocol.

* * * * *

UNITED STATES PATENT AND TRADEMARK OFFICE
CERTIFICATE OF CORRECTION

PATENT NO. : 7,613,958 B2 Page 1 of 1
APPLICATION NO. : 10/756529
DATED : November 3, 2009
INVENTOR(S) : Gregg Bernard Lesartre et al.

It is certified that error appears in the above-identified patent and that said Letters Patent is hereby corrected as shown below:

In column 18, line 52, in Claim 8, delete "deseriatizers" and insert -- deserializers --, therefor.

Signed and Sealed this

Sixteenth Day of February, 2010

David J. Kappos
*Director of the United States Patent and Trademark Office*